(12) United States Patent
Oh

(10) Patent No.: US 11,862,608 B2
(45) Date of Patent: Jan. 2, 2024

(54) SEMICONDUCTOR PACKAGE

(71) Applicant: SAMSUNG ELECTRONICS CO., LTD., Suwon-si (KR)

(72) Inventor: Jooyoung Oh, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 164 days.

(21) Appl. No.: 17/405,129

(22) Filed: Aug. 18, 2021

(65) Prior Publication Data
US 2022/0208729 A1 Jun. 30, 2022

(30) Foreign Application Priority Data

Dec. 24, 2020 (KR) .......................... 10-2020-0183046

(51) Int. Cl.
*H01L 25/065* (2023.01)
*H01L 25/18* (2023.01)
*H01L 23/00* (2006.01)

(52) U.S. Cl.
CPC ...... *H01L 25/0657* (2013.01); *H01L 25/0652* (2013.01); *H01L 25/0655* (2013.01); *H01L 25/18* (2013.01); *H01L 24/32* (2013.01); *H01L 24/49* (2013.01); *H01L 24/73* (2013.01); *H01L 2224/32145* (2013.01); *H01L 2224/32225* (2013.01); *H01L 2224/49176* (2013.01); *H01L 2224/73215* (2013.01); *H01L 2224/73265* (2013.01); *H01L 2225/0651* (2013.01); *H01L 2225/06506* (2013.01); *H01L 2225/06562* (2013.01); *H01L 2225/06586* (2013.01)

(58) Field of Classification Search
CPC .................................................. H01L 25/0652
See application file for complete search history.

(56) References Cited

U.S. PATENT DOCUMENTS

| 8,378,472 | B2 | 2/2013 | Matsuno et al. |
| 8,946,909 | B2 | 2/2015 | Cho et al. |
| 9,455,235 | B2 | 9/2016 | Kim |
| 9,502,341 | B2 | 11/2016 | Song et al. |
| 10,199,319 | B2 | 2/2019 | Shim et al. |
| 10,748,872 | B2 | 8/2020 | Kinsley |
| 2011/0042797 | A1 | 2/2011 | Park et al. |
| 2016/0313773 | A1 | 10/2016 | Kim et al. |
| 2018/0026022 | A1* | 1/2018 | Lee .......................... H01L 24/48 257/659 |

FOREIGN PATENT DOCUMENTS

| KR | 1020120032764 | 4/2012 |
| KR | 1020160125804 | 11/2016 |

* cited by examiner

*Primary Examiner* — Yu-Hsi D Sun
(74) *Attorney, Agent, or Firm* — F. Chau & Associates, LLC

(57) ABSTRACT

A semiconductor package includes a package substrate having a first insulating layer, a wiring layer disposed on the first insulating layer, and a second insulating layer disposed on the first insulating layer and covering at least a portion of the wiring layer, a pair of support members disposed to face each other on the second insulating layer of the package substrate, and a pair of semiconductor chips disposed between the pair of support members and electrically connected to the wiring layer, wherein the second insulating layer has an opening surrounding at least a portion of each of the pair of semiconductor chips.

20 Claims, 21 Drawing Sheets

SEMICONDUCTOR PACKAGE

CROSS-REFERENCE TO RELATED APPLICATION(S)

This application claims priority under 35 USC § 119 to Korean Patent Application No. 10-2020-0183046 filed on Dec. 24, 2020 in the Korean Intellectual Property Office, the disclosure of which is herein incorporated by reference in its entirety.

FIELD

The present disclosure relates generally to semiconductor packages, and more particularly to a semiconductor package with extended clearance for molding.

DISCUSSION OF RELATED ART

Semiconductor packages mounted in electronic devices are increasingly required to have both high performance and high capacity. Accordingly, semiconductor packages including a plurality of semiconductor chips and control chips controlling operations thereof have been developed.

SUMMARY

Embodiments of the present disclosure may provide semiconductor packages having increased production yields.

According to an embodiment of the present disclosure, a semiconductor package includes: a package substrate including a first insulating layer, a wiring layer disposed on the first insulating layer, and a second insulating layer disposed on the first insulating layer and covering at least a portion of the wiring layer; first and second support members disposed to face each other on the second insulating layer of the package substrate and spaced apart from each other in a first direction; first and second semiconductor chips disposed between the first and second support members and spaced apart from each other in a second direction, which intersects the first direction; a stack structure disposed on the first and second support members and the first and second semiconductor chips and including at least one third semiconductor chip; and an encapsulant disposed on the package substrate and filling a space between the first and second support members and a space between the first and second semiconductor chips, wherein the second insulating layer has an opening exposing at least a portion of the first insulating layer positioned between the first and second semiconductor chips, and the opening is filled with the encapsulant.

According to an embodiment of the present disclosure, a semiconductor package includes: a package substrate including a first insulating layer, a wiring layer disposed on the first insulating layer, and a second insulating layer disposed on the first insulating layer and covering at least a portion of the wiring layer; a pair of support members disposed to face each other on the second insulating layer of the package substrate; and a pair of semiconductor chips disposed between the pair of support members and electrically connected to the wiring layer, wherein the second insulating layer has an opening surrounding at least a portion of each of the pair of semiconductor chips.

According to an embodiment of the present disclosure, a semiconductor package includes: a package substrate; a pair of support members disposed on the package substrate and facing each other in a first direction; at least a pair of semiconductor chips disposed between the pair of support members on the package substrate and facing each other in a second direction, which intersects the first direction; a stack structure disposed on the pair of support members and the pair of semiconductor chips; and an encapsulant disposed on the package substrate and filling a space between the pair of support members and the pair of semiconductor chips, wherein the package substrate includes a first insulating layer and a second insulating layer disposed between the first insulating layer and the pair of support members and the pair of semiconductor chips, and the encapsulant is in contact with at least a portion of the first insulating layer between the pair of support members and the pair of semiconductor chips.

BRIEF DESCRIPTION OF DRAWINGS

The above and other embodiments of the present disclosure will be more clearly understood from the following detailed description, taken in conjunction with the accompanying drawings, in which.

DETAILED DESCRIPTION

Hereinafter, embodiments of the present disclosure will be described with reference to the accompanying drawings.

Figure 1A:
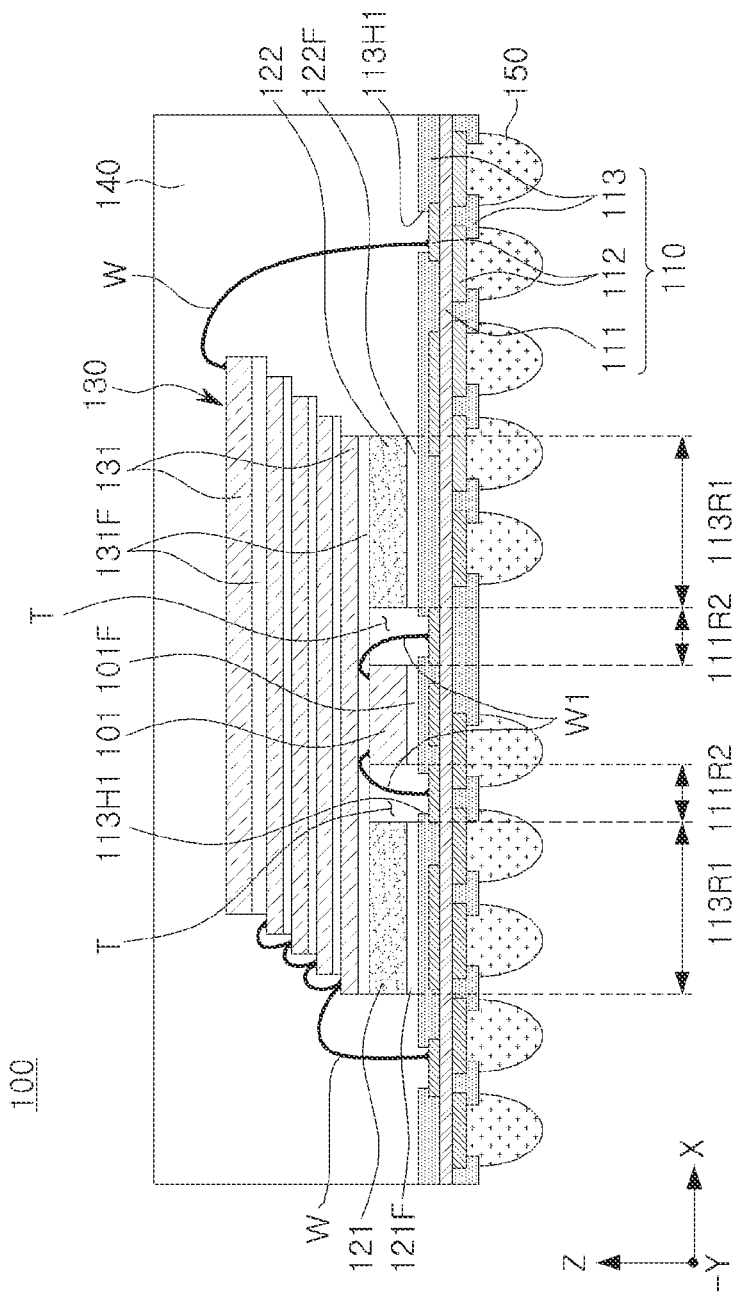
FIG. 1A is a cross-sectional diagram illustrating an X-Z plane of a semiconductor package according to an embodiment of the present disclosure.
Figure 1B:
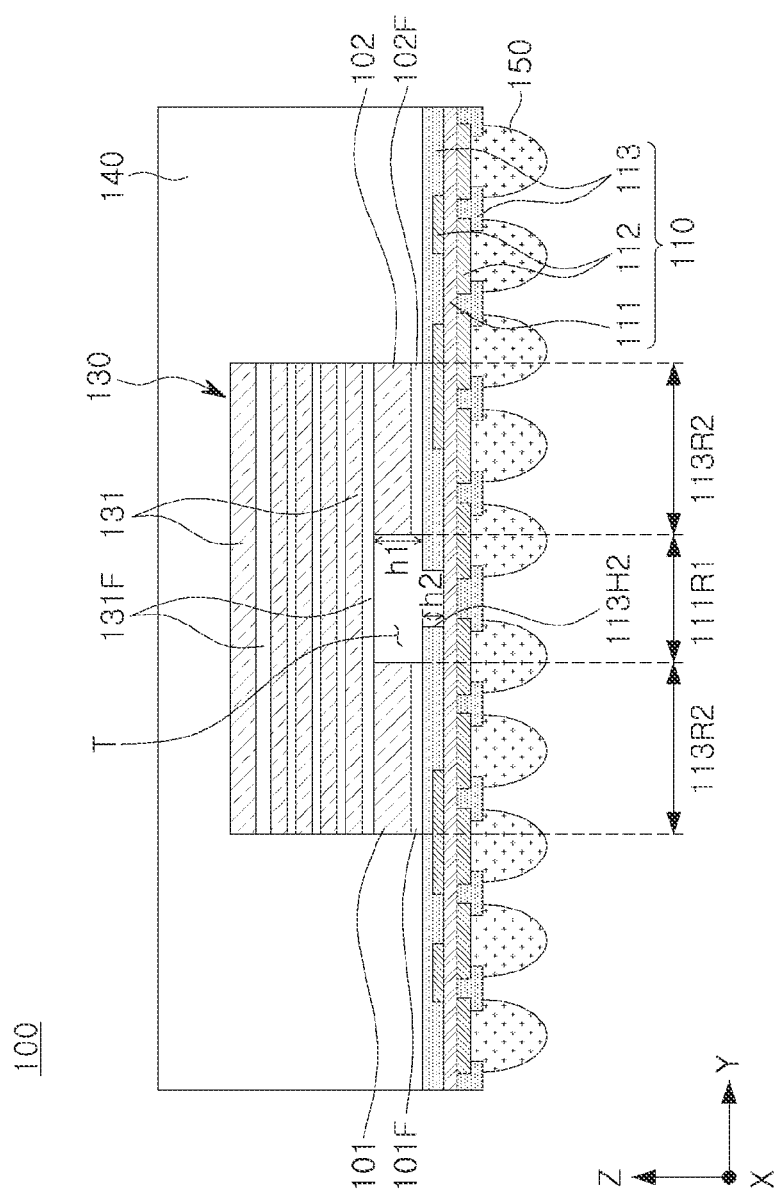
FIG. 1B is a cross-sectional diagram illustrating a Y-Z plane of the semiconductor package illustrated in FIG. 1A.

FIG. 1A illustrates an X-Z plane of a semiconductor package 100 according to an embodiment of the present disclosure, and FIG. 1B illustrates a Y-Z plane of the semiconductor package 100 illustrated in FIG. 1A.

Referring to FIGS. 1A and 1B, a semiconductor package 100 of an embodiment may include a package substrate 110, at least a pair of semiconductor chips 101 and 102, and at least a pair of support members 121 and 122, a stack structure 130, and an encapsulant 140. In addition, the semiconductor package 100 may further include a plurality of connection bumps 150 disposed under the package substrate 110.

The package substrate 110 may include a first insulating layer 111, wiring layers 112, and second insulating layers 113. The package substrate 110 may further include a via structures electrically connecting the wiring layers 112 disposed at different levels. The package substrate 110 may be a substrate for a semiconductor package including a printed circuit board (PCB), a ceramic substrate, a glass substrate, a tape wiring board, or the like.

The first insulating layer 111 may include an insulating resin. The insulating resin may include a thermosetting resin such as an epoxy resin, a thermoplastic resin such as polyimide, or a resin obtained by impregnating an inorganic filler or/and glass fiber (e.g., glass cloth or glass fabric) with these resins, for example, prepreg, Ajinomoto build-up film (ABF), glass-reinforced epoxy laminate material (e.g., NEMA grade FR-4), bismaleimide triazine (BT), or the like. The insulating resin may include a photosensitive resin such as a photo-imageable dielectric (PID) resin. For example, when the package substrate 110 is a PCB substrate, the first insulating layer 111 may be a core insulating layer (e.g., a prepreg) of a copper clad laminate. The first insulating layer 111 may have a form in which a greater number of insulating layers are stacked in a vertical direction (Z-axis direction) than that illustrated in the drawing. In this case, a boundary between the first insulating layers at different levels may not be apparent according to processes.

The wiring layers 112 may be disposed on the first insulating layer 111 and may form an electrical path in the package substrate 110. The wiring layers 112 may include at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C), an alloy including two or more metals thereof, or other conductive materials. The wiring layers 112 may be provided with fewer or more layers (e.g., one layer or three or more layers) than those illustrated in the drawings. The wiring layers 112 is disposed adjacent to at least a pair of semiconductor chips 101 and 102 and may include a plurality of wiring pads (e.g., "112P" in FIG. 6A) electrically connected to the semiconductor chips 101 and 102.

The second insulating layers 113 may be disposed on the first insulating layer 111 and may cover at least a portion of the wiring layers 112. The second insulating layers 113 may include an insulating resin or an insulating material different from the first insulating layer 111. For example, the second insulating layers 113 may include a solder resist disposed above and below the first insulating layer 111 to protect the wiring layers 112. The second insulating layers 113 may include a plurality of holes 113H1 exposing at least a portion (e.g., a wiring pad) of the wiring layers 112 and an opening 113H2 exposing at least a portion of the first insulating layer 111 positioned between the pair of semiconductor chips 101 and 102. The opening 113H2 is filled with the encapsulant 140, and accordingly, the encapsulant 140 may directly contact the first insulating layer 111 through the opening 113H2. In the present disclosure, the first insulating layer 111 may include an insulating resin having a greater adhesion to the encapsulant 140 than the second insulating layers 113. The plurality of holes 113H1 and the opening 113H2 may be formed by removing portions of the second insulating layers 113 by photolithography or the like. The second insulating layers 113 may include a first mounting region 113R1 corresponding to at least a pair of support members 121 and 122 and a second mounting region 113R2 corresponding to at least a pair of semiconductor chips 101 and 102.

In an embodiment, in a region in which non-filling and swelling of the encapsulant 140 might occur, the opening 113H2 may increase a height of a passage through which the encapsulant 140 in an uncured state flows and induce contact between the encapsulant 140 and the first insulating layer 111, thereby preventing non-filling and swelling of the encapsulant 140. For example, the first insulating layer 111 may have a first region 111R1 positioned between the pair of semiconductor chips 101 and 102 and a second region 111R2 positioned between the pair of semiconductor chips 101 and 102 and the pair of support members 121 and 122. The opening 113H2 may include a first recess region (See "113H2" of FIG. 1C) exposing at least a portion of the first region 111R1 and extending in a first direction (e.g., the X-axis direction). A tunnel structure T may be formed on the first and second regions 111R1 and 111R2. A side surface of the tunnel structure T may be surrounded by at least portions of the pair of semiconductor chips 101 and 102 and the pair of support members 121 and 122 and an upper surface thereof may be covered by the stack structure 130. Therefore, when the uncured encapsulant 140 passes on the first and second regions 111R1 and 111R2 or through the tunnel structure T, a flow of the encapsulant 140 may be obstructed and voids might occur. However, according to embodiments of the present disclosure, flowability of the encapsulant 140 on the first and second regions 111R1 and 111R2 and adhesion of the encapsulant 140 and the package substrate 110 may be increased to prevent the occurrence of a void and swelling.

In an example, in the third direction (Z-axis direction), substantially perpendicular to the first direction (X-axis direction) and the second direction (Y-axis direction), a height h1 from an upper surface of the second insulating layers 113 to an upper surface of each of the pair of semiconductor chips 101 and 102 and the pair of support members 121 and 122 may range from about 40 μm to about 100 μm, and a height h2 of the opening 113H2 on the first and/or second regions 111R1 and 111R2 may range from about 10 μm to about 30 μm or from about 15 μm to about 30 μm. In addition, in an example, the first insulating layer 111 may be a prepreg, the second insulating layers 113 may be a solder resist, and the encapsulant 140 may be an epoxy molding compound (EMC).

After the encapsulant 140 was attached to each of the first and second insulating layers 111 and 113, shear stress was measured as illustrated in Table 1 below. In Examples 1 to 3, the encapsulant 140 in the form of a lump was attached to and cured on the first insulating layer 111 and shear stress between the encapsulant 140 and the first insulating layer 111 was measured by applying a shear force. In Comparative Examples 1 to 3, shear stress was measured under the same conditions as in Examples 1 to 3, except that the encapsulant 140 was positioned on the second insulating layers 113, respectively. Referring to Table 1, an average shear stress in Examples 1 to 3 is greater than an average shear stress in Comparative Examples 1 to 3, which may be understood that adhesion between the encapsulant 140 and the first insulating layer 111 is stronger than adhesion between the encapsulant 140 and the second insulating layers 113.

TABLE 1

| Classification | Shear stress (kgf) | | |
| --- | --- | --- | --- |
|  | Minimum | Maximum | Average |
| Example 1 | 5.2 | 9.2 | 6.9 |
| Example 2 | 6.1 | 8.3 | 7.0 |
| Example 3 | 5.1 | 9.5 | 6.4 |
| Comparative Example 1 | 2.5 | 7.4 | 5.4 |
| Comparative Example 2 | 3.5 | 6.5 | 4.9 |
| Comparative Example 3 | 3.0 | 7.3 | 5.2 |

At least a pair of semiconductor chips 101 and 102 may be disposed between a pair of support members 121 and 122 and may be spaced apart from each other in a second direction (Y-axis direction). For example, at least a pair of semiconductor chips 101 and 102 may be disposed between first and second support members 121 and 122 spaced apart in the first direction (X-axis direction) on the package substrate 110 and may face each other in the second direction (Y-axis direction). At least a pair of semiconductor chips 101 and 102 is attached on the second insulating layers 113 of the package substrate 110 by adhesive members 101F and 102F (e.g., DAF) and may be electrically connected to the wiring layers 112 of the package substrate 110 by a bonding wire W. The at least a pair of semiconductor chips 101 and 102 may include a control unit that controls a signal for at least one third semiconductor chip 131 included in the stack structure 130. For example, when the third semiconductor chip 131 is a memory chip, the first and second semiconductor chips 101 and 102 may separately include a memory controller and a frequency boosting interface (FBI) chip. The memory controller may determine a data processing order of the memory chip and prevent errors and bad sectors, and an FBI chip may speed up an I/O.

At least a pair of support members 121 and 122 may be positioned on the package substrate 110 and may be spaced apart from each other in the first direction (X-axis direction). For example, the first and second support members 121 and 122 may be disposed to face each other in the first direction, and the first and second semiconductor chips 101 and 102 facing each other in the second direction (Y-axis direction), substantially perpendicular to the first direction (X-axis direction), between the first and second support members 121 and 122. The at least a pair of support members 121 and 122 may have a height substantially equal to or greater than the at least a pair of semiconductor chips 101 and 102 so as to support the stack structure 130. For example, heights from the upper surface of the second insulating layers 113 to upper surfaces of the first and second semiconductor chips 101 and 102 and the first and second support members 121 and 122 may be substantially the same. The at least a pair of support members 121 and 122 may be attached to the package substrate 110 by the adhesive members 121F and 122F and may be a dummy semiconductor chip including a semiconductor material. In the present disclosure, the at least a pair of support members 121 and 122 are not particularly limited in a shape and material and may have various shapes and include various materials in consideration of a relationship with surrounding elements (e.g., coefficient of thermal expansion, modulus of elasticity, etc.).

The stack structure 130 may include at least one third semiconductor chip 131. The at least one third semiconductor chip 131 may be stacked on the at least a pair of semiconductor chips 101 and 102 and the at least a pair of support members 121 and 122 in the vertical direction (Z-axis direction). For example, a plurality of third semiconductor chips 131 attached to each other by an adhesive member 131F may be stacked on at least a pair of semiconductor chips 101 and 102 and at least a pair of support members 121 and 122. The at least one third semiconductor chip 131 may include a logic chip such as a central processor (CPU), a graphic processor (GPU), a field programmable gate array (FPGA), a digital signal processor, an encryption processor, a microprocessor, a microcontroller, an analog-to-digital converter (ADC), and an application-specific IC (ASIC), or a memory chip such as a volatile memory (e.g., DRAM), a non-volatile memory (e.g., ROM), and a flash memory. In an example, the at least one third semiconductor chip 131 may include a NAND flash memory. Each semiconductor chip 131 may have a wire W that extends from a top surface of the semiconductor chip 131 through a hole 113H1 to a wiring layer 112, without limitation thereto.

The encapsulant 140 may be positioned on the package substrate 110 and may fill a space between at least a pair of support members 121 and 122 and a space between at least a pair of semiconductor chips 101 and 102. The encapsulant 140 may include an insulating material, for example, a thermosetting resin such as an epoxy resin, a thermoplastic resin such as polyimide, a prepreg including an inorganic filler or/and a glass fiber, Ajinomoto build-up film (ABF), FR-4, bismaleimide triazine (BT), EMC, and the like. As described above, a non-filling and swelling phenomenon of the encapsulant 140 may occur on the first and second regions 111R1 and 111R2 in which a flow space of the encapsulant 140 is not sufficient. However, in an embodiment, the encapsulant 140 may be in contact with at least a portion of the first and/or second regions 111R1 and 111R2 of the first insulating layer 111 between the pair of support members 121 and 122 and between the pair of semiconductor chips 101 and 102, thereby increasing adhesion with the package substrate 110.

The plurality of connection bumps 150 may have a land, a ball, or a pin shape. The plurality of connection bumps 150 may include, for example, tin (Sn) or an alloy containing tin (Sn) (e.g., Sn—Ag—Cu). The plurality of connection bumps 150 may be electrically connected to the wiring layers 112 of the package substrate 110 and may be electrically connected to an external device such as a module substrate, a system board, etc.

Figure 1C:
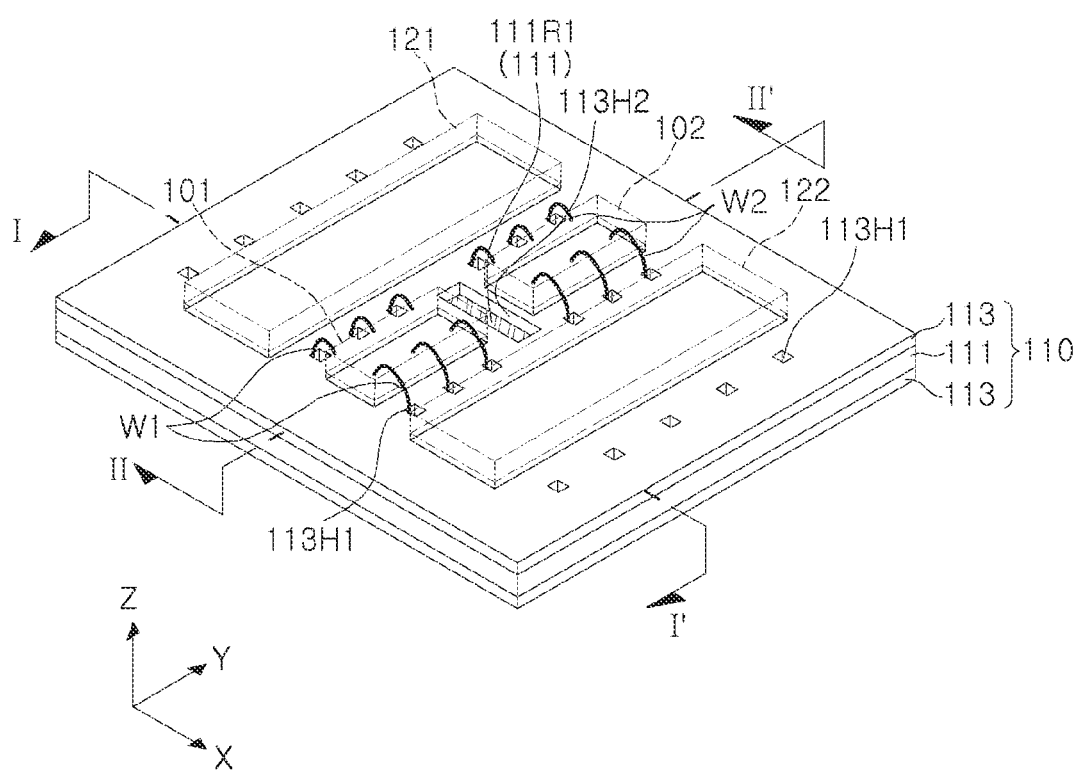
FIG. 1C is a perspective diagram illustrating some components of the semiconductor package illustrated in FIGS. 1A and 1B.

Hereinafter, the relationship among the pair of support members 121 and 122, the pair of semiconductor chips 101 and 102, and the package substrate 110 in the package 100 of an embodiment will be described in detail with reference to FIG. 1C. FIG. 1C illustrates some components of the semiconductor package 100 illustrated in FIGS. 1A and 1B. FIG. 1C illustrates the first and second support members 121 and 122, the first and second semiconductor chips 101 and 102, and the package substrate 110 of the semiconductor package 100. Lines I-I' and II-II' in FIG. 1C represent cross-sections corresponding to FIGS. 1A and 1B, respectively.

Referring to FIGS. 1A and 1B together with FIG. 1C, the semiconductor package of an embodiment includes the package substrate 110 including the first insulating layer 111 and the second insulating layers 113, a pair of support members 121 and 122 positioned to face each other on the second insulating layer of the package substrate 110, and at least a pair of semiconductor chips 101 and 102 electrically connected to the package substrate 110. Here, the second insulating layers 113 may have the opening 113H2 surrounding at least a portion of each of the pair of semiconductor chips 101 and 102 on the X-Y plane. For example, the opening 113H2 may have a form of a trench extending in the first direction (X-axis direction) between the first semiconductor chip 101 and the second semiconductor chip 102 and exposing at least a portion of the first region 111R1 of the first insulating layer 111 in the third direction (Z-axis direction). In the drawing, the opening 113H2 is positioned between the first semiconductor chip 101 and the second semiconductor chip 102, but embodiments of the present disclosure are not limited thereto. In an example, the opening 113H2 may be disposed adjacent the first semiconductor chip 101 and the second semiconductor chip 102 except therebetween.

In an example, a width of the opening 113H2 in the second direction (Y-axis direction) may be smaller than a width of the first region 111R1, and a length of the opening 113H2 in the first direction (X-axis direction) may be greater than a width of the first and second semiconductor chips 101 and 102. For example, the opening 113H2 may extend to the second region 111R2 of FIG. 1A. The trench-shaped opening 113H2 illustrated in FIG. 1C may be formed in a portion where the non-filling phenomenon of the encapsulant 140 is concentrated to increase flowability of the encapsulant 140 and prevent non-filling and swelling. In addition, the second insulating layers 113 is disposed between the first insulating layer 111 and the pair of support members 121 and 122 and the pair of semiconductor chips 101 and 102 to provide mounting regions 113R1 and 113R2 of the support members 121 and 122 and the semiconductor chips 101 and 102 and protect the wiring layers 112.

Figure 1D:
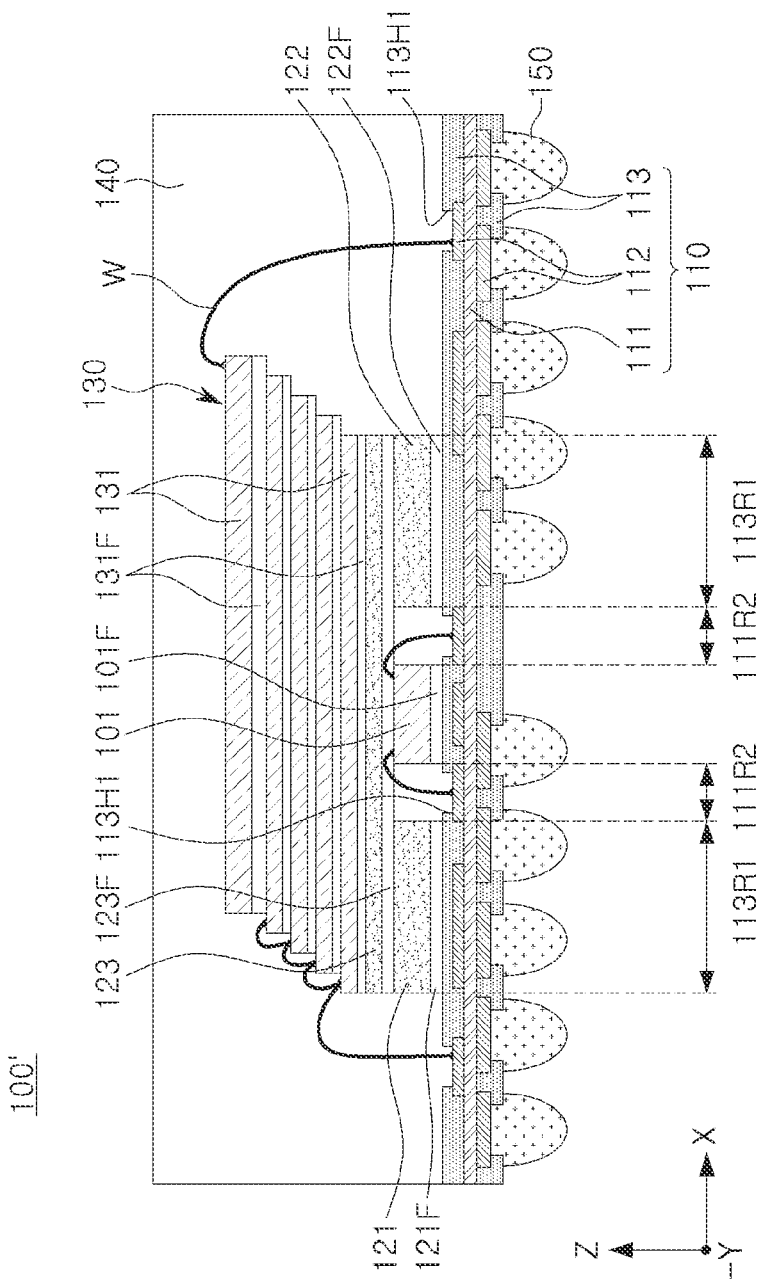
FIG. 1D is a cross-sectional diagram illustrating a modification of the semiconductor package illustrated in FIG. 1A.

Hereinafter, a modification of the semiconductor package 100 illustrated in FIG. 1A will be described with reference to FIG. 1D. FIG. 1D illustrates an alternate embodiment modification of the semiconductor package illustrated in FIG. 1A. In FIG. 1D, components having the same reference numerals as those of FIGS. 1A and 1B have substantially the same or similar features as those described above, and thus redundant descriptions may be omitted.

Referring to FIG. 1D, an alternate embodiment semiconductor package 100' may include a third support substrate 123 disposed between the stack structure 130 and the first and second support members 121 and 122. The third support member 123 may be a dummy semiconductor chip formed of a material which is the same as or similar to the first and second support members 121 and 122. The third support member 123 may be attached on the first and second support members 121 and 122 by an adhesive member 123F. In an embodiment, the adhesive member 123F may be formed above wires W1 and W2 that extend from top surfaces of the semiconductor chips 101 and 102, respectively, through a hole 113H1 to a wiring layer 112, without limitation thereto. In another embodiment, the wires W1 and W2 may extend from side or edge surfaces of the semiconductor chips 101 and 102 through the holes 113H1. In yet another embodiment, portions of the wires W1 and W2 may pass through the adhesive member 123F.

The third support member 123 may have an area for covering the first and second support members 121 and 122 and the first and second semiconductor chips 101 and 102 between the first and second support members 121 and 122 on the X-Y plane. A height of the third support member 123 may be smaller than heights of the first and second support members 121 and 122 and the first and second semiconductor chips 101 and 102. For example, the height of each of the first and second support members 121 and 122 and the first and second semiconductor chips 101 and 102 may range from about 30 µm to about 70 µm, and the height of the third support member 123 may range from about 20 µm to about 60 µm.

Figure 2A:
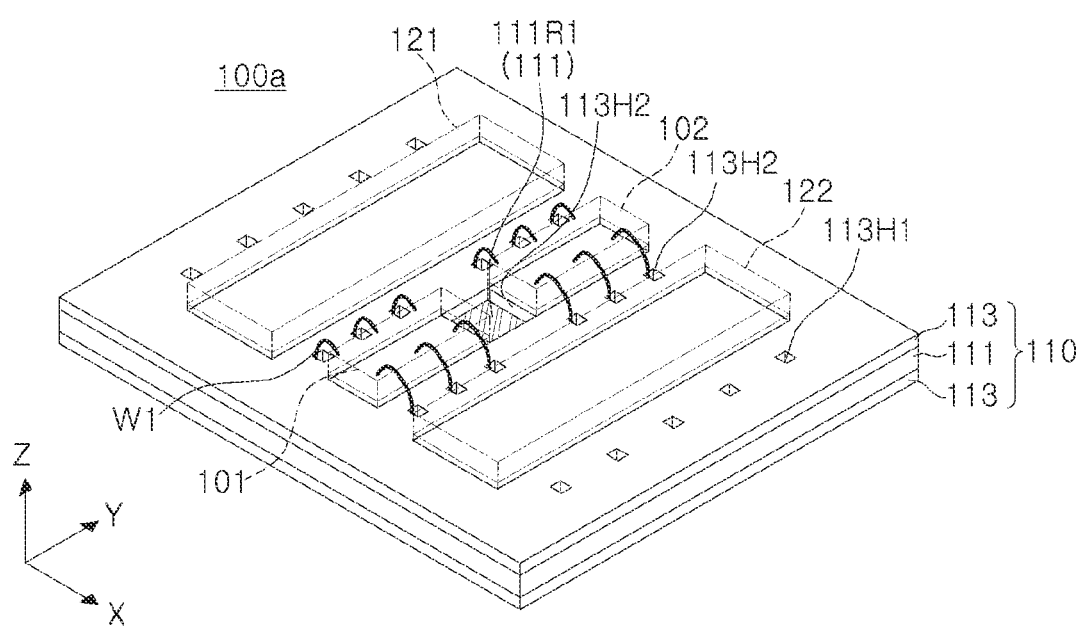
FIG. 2A is a perspective diagram illustrating some components of a semiconductor package according to an embodiment of the present disclosure.
Figure 2B:
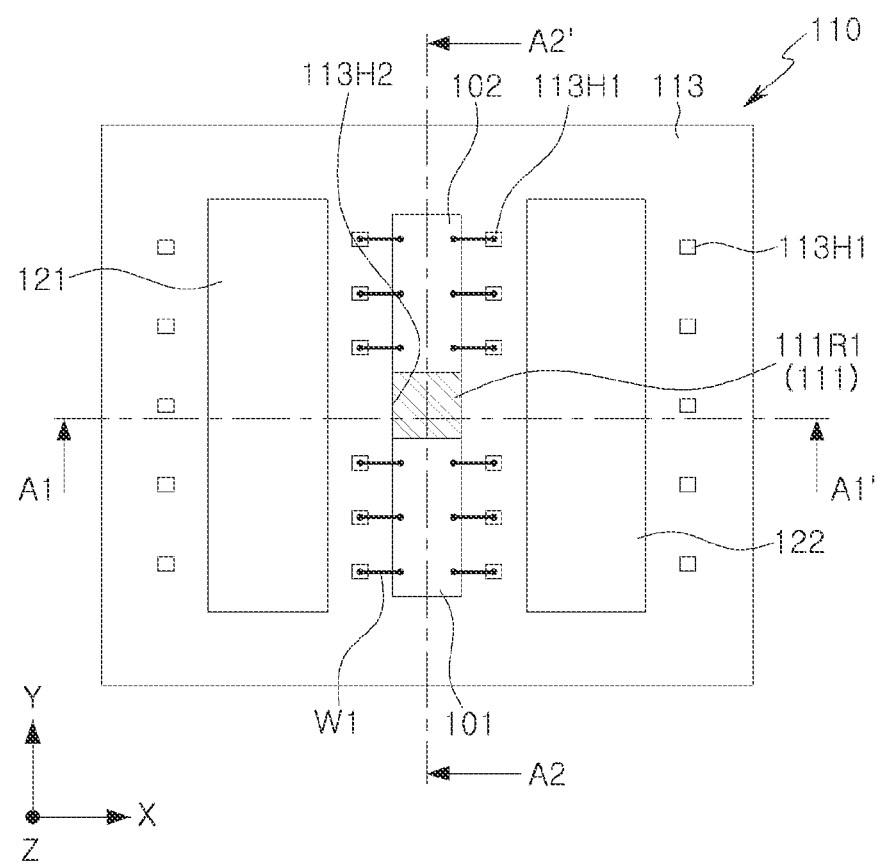
FIG. 2B is a plan diagram illustrating the components illustrated FIG. 2A.
Figure 3A:
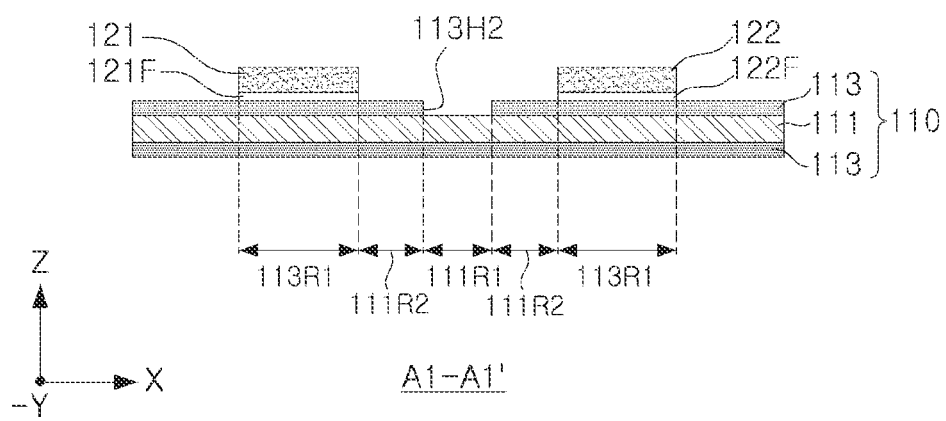
FIG. 3A is a cross-sectional diagram taken along line A1-A1' of FIG. 2B.
Figure 3B:
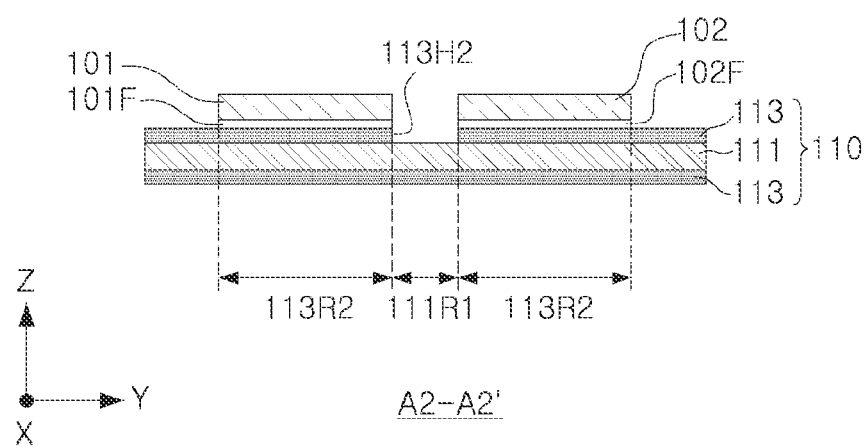
FIG. 3B is a cross-sectional diagram taken along line A2-A2' of FIG. 2B.

FIG. 2A illustrates some components of a semiconductor package 100a according to an embodiment of the present disclosure, FIG. 2B illustrates the components illustrated FIG. 2A, FIG. 3A illustrates a view taken along line A1-A1' of FIG. 2B, and FIG. 3B illustrates a view taken along line A2-A2' of FIG. 2B. FIG. 2A illustrates a relationship among the first and second support members 121 and 122, the first and second semiconductor chips 101 and 102, and the package substrate 110. In FIGS. 2A through 3B, components having the same reference numerals as those of FIGS. 1A to 1C have substantially the same or similar features as those described above, and thus, redundant descriptions thereof will be omitted.

Referring to FIGS. 2A through 3B, in the semiconductor package 100a of an embodiment, the opening 113H2 may have a form of a recess or cavity exposing the first region 111R1 of the first insulating layer 111 between the first semiconductor chip 101 and the second semiconductor chip 102. Here, the opening 113H2 may expose the first region 111R1 in a range in which the opening 113H2 does not overlap the first and second semiconductor chips 101 and 102 in the third direction (Z-axis direction). For example, as illustrated in FIG. 3A, a width of the opening 113H2 in the first direction (X-axis direction) may be substantially equal to a width of the first region 111R1 or the first and second semiconductor chips 101 and 102. In addition, as illustrated in FIG. 3B, a width of the opening 113H2 in the second direction (Y-axis direction) may be substantially equal to a width of the first region 111R1 or a width of the first and second semiconductor chips 101 and 102. Depending on the arrangement of the first and second support members 121 and 122 and the first and second semiconductor chips 101 and 102, a non-filling phenomenon of the encapsulant 140 may concentratively appear on the first region 111R1. In an embodiment, the opening 113H2 may be formed to provide the mounting region 113R2 of the first and second semiconductor chips 101 and 102 on the second insulating layers 113 and protect a wiring layer disposed under the first and second semiconductor chips 101 and 102, while maximizing an exposure area of the first region 111R1.

Figure 4A:
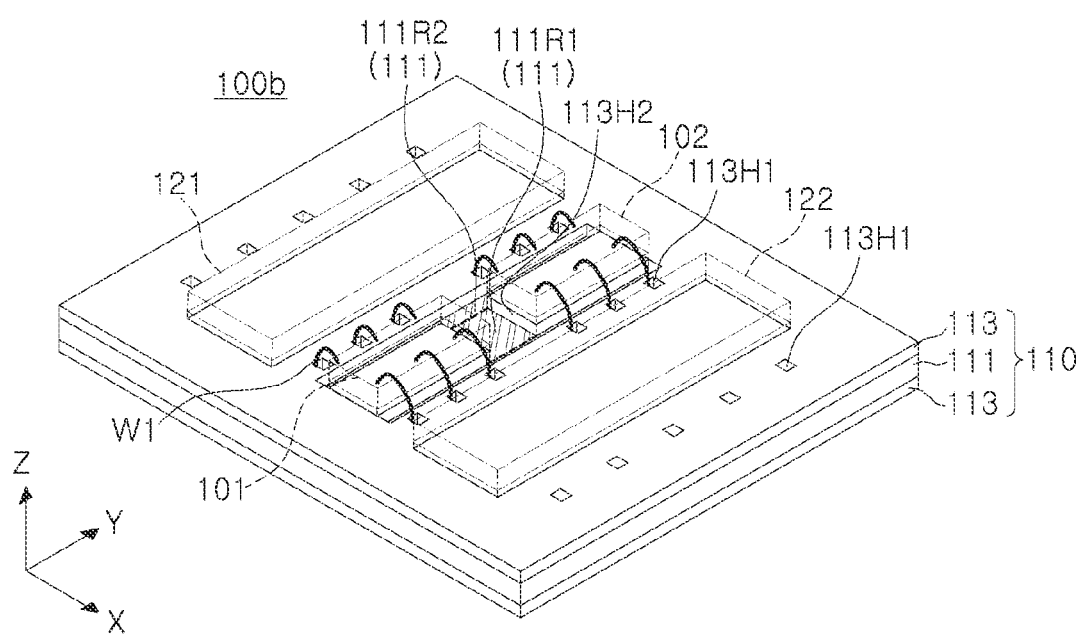
FIG. 4A is a perspective diagram illustrating some components of a semiconductor package according to an embodiment of the present disclosure.
Figure 4B:
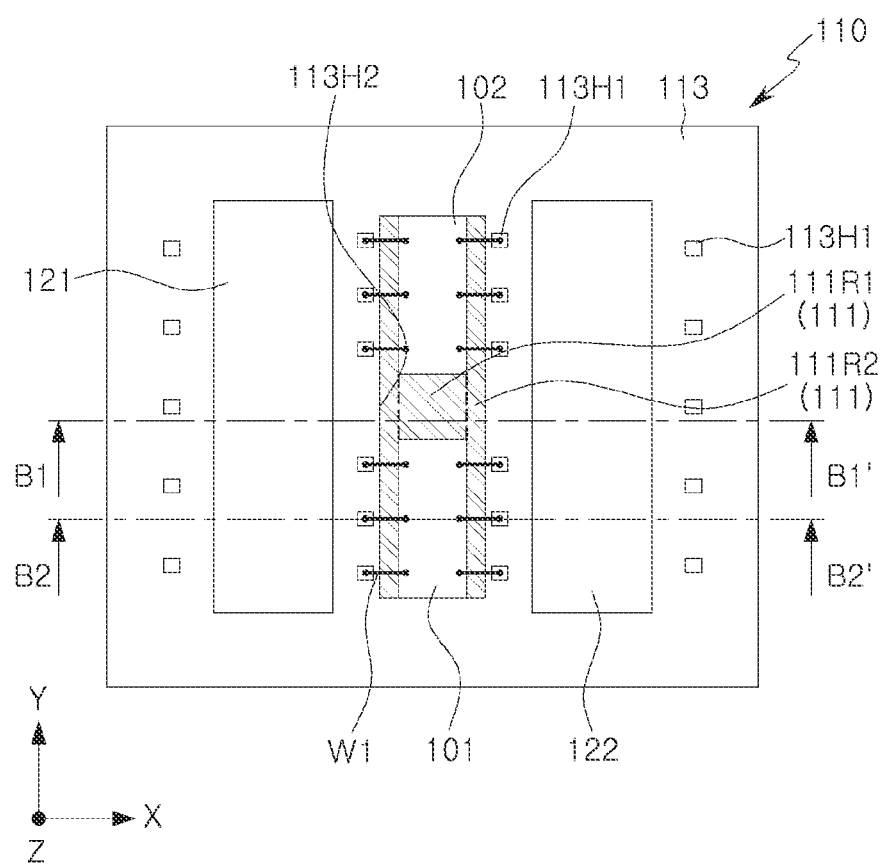
FIG. 4B is a plan diagram illustrating the components illustrated FIG. 4A.
Figure 5A:
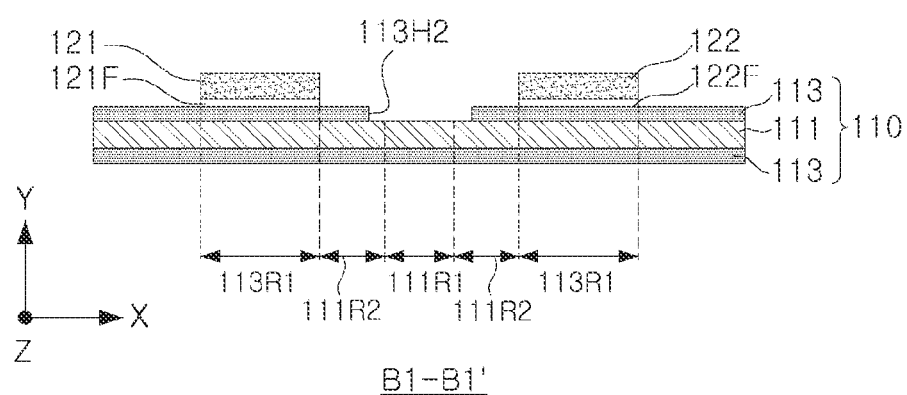
FIG. 5A is a cross-sectional diagram taken along line B1-B1' of FIG. 4B.
Figure 5B:
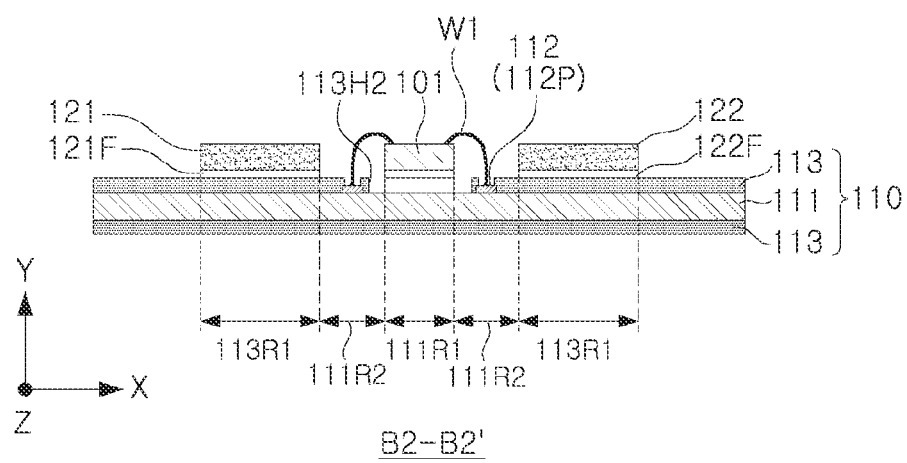
FIG. 5B is a cross-sectional diagram taken along line B2-B2' of FIG. 4B.

FIG. 4A illustrates some components of a semiconductor package 100b according to an embodiment of the present disclosure, FIG. 4B illustrates the components illustrated FIG. 4A, FIG. 5A illustrates a view taken along line B1-B1' of FIG. 4B, and FIG. 5B illustrates a view taken along line B2-B2' of FIG. 4B. FIG. 4A illustrates a relationship among the second support members 121 and 122, the first and second semiconductor chips 101 and 102, and the package substrate 110. In FIGS. 4A through 5B, components having the same reference numerals as those of FIGS. 1A to 1C have substantially the same or similar features as those described above, and thus, redundant descriptions thereof will be omitted.

Referring to FIGS. 4A to 5B, in a semiconductor package 100*b* of an embodiment, the opening 113H2 may further include a second recess region extending from one end of a first recess region corresponding to the first region 111R1 in the second direction (Y-axis direction) and exposing at least a portion of the second region 111R2. Here, the opening 113H2 may expose at least portions of the respective first region 111R1 and second region 111R2 within a range not overlapping the first and second semiconductor chips 101 and 102 a wiring pad ("112P" of FIG. 5B). For example, as illustrated in FIG. 5A, the width of the opening 113H2 in the first direction (X-axis direction) may be greater than the width of the first region 111R1 or the first and second semiconductor chips 101 and 102. In addition, as illustrated in FIG. 5B, the opening 113H2 may not extend to one end of the wiring pad 112P to which the first and second semiconductor chips 101 and 102 are connected, in the first direction (X-axis direction), and may be covered by the second insulating layers 113. However, in embodiments of the present disclosure, the wiring pad 112P is not limited to a solder mask defined (SMD) form and may be configured in a non-solder mask defined (NSMD) form. Depending on the arrangement of the first and second support members 121 and 122 and the first and second semiconductor chips 101 and 102, a non-filling phenomenon of the encapsulant 140 may appear even in the second region 111R2, as well as in the first region 111R1. In an embodiment, the opening 113H2 may be formed to protect the wiring pad 112P, while exposing a portion of the second region 111R2.

Figure 6A:
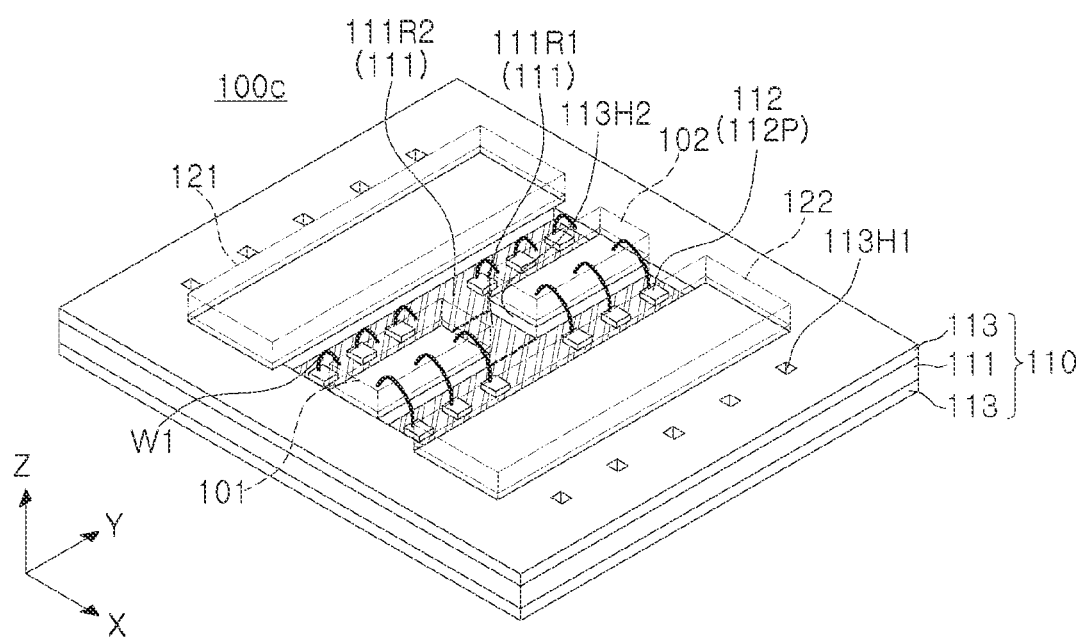
FIG. 6A is a perspective diagram illustrating some components of a semiconductor package according to an embodiment of the present disclosure.
Figure 6B:
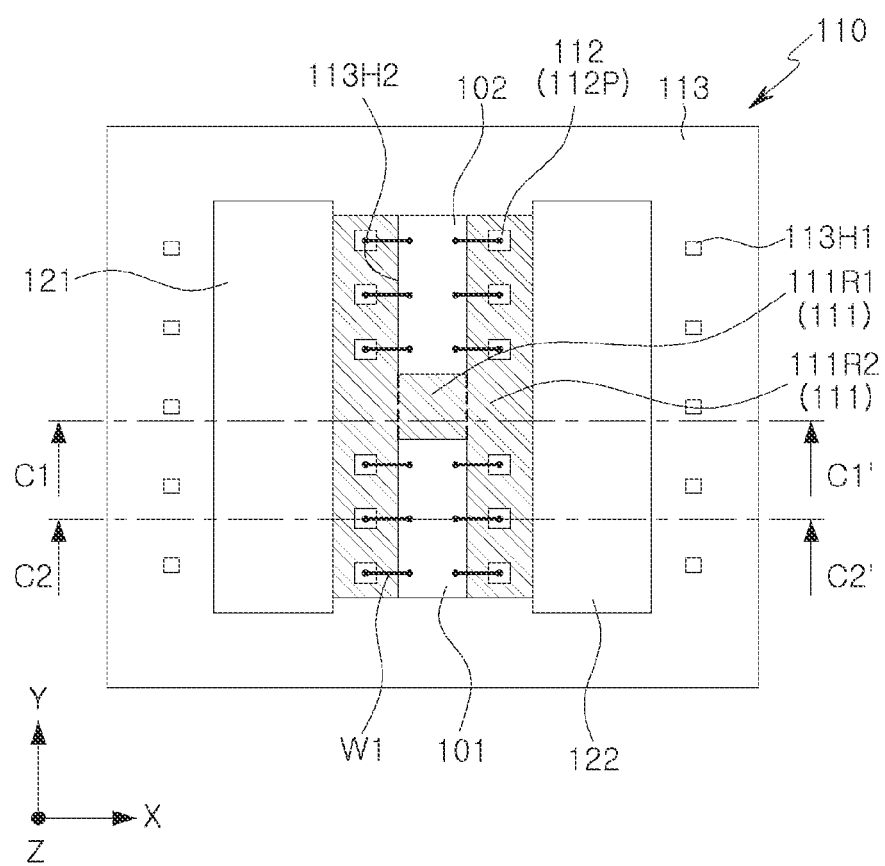
FIG. 6B is a plan diagram illustrating the components illustrated FIG. 6A.
Figure 7A:
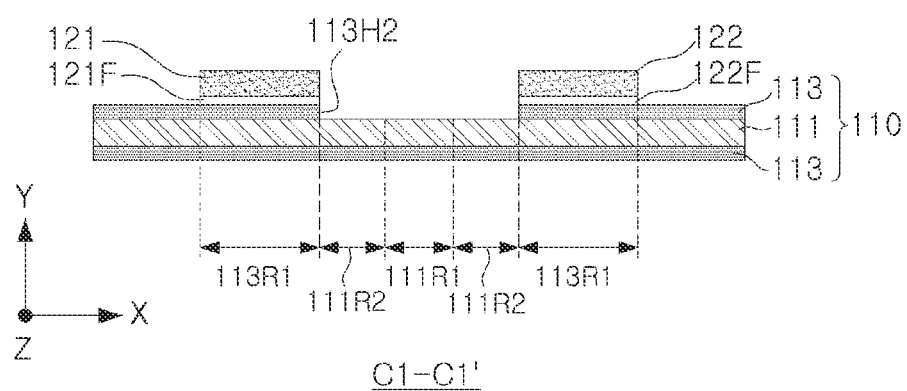
FIG. 7A is a cross-sectional diagram taken along line C1-C1' of FIG. 6B.
Figure 7B:
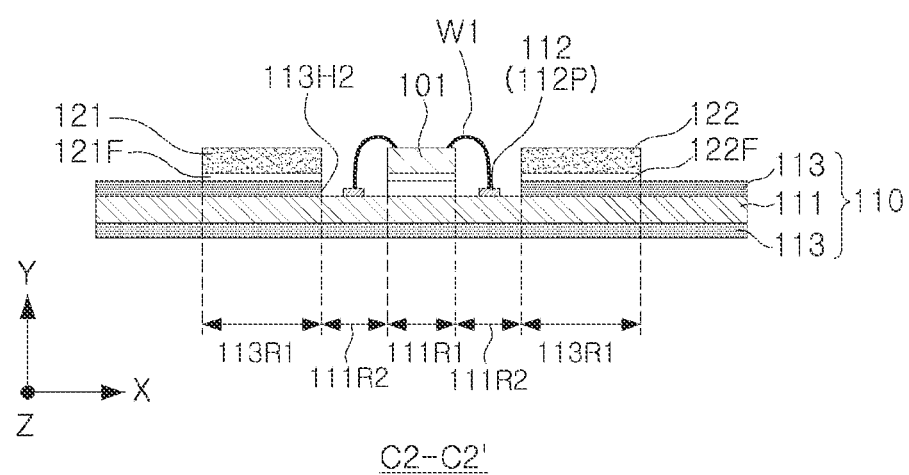
FIG. 7B is a cross-sectional diagram taken along line C2-C2' of FIG. 6B.

FIG. 6A illustrates some components of a semiconductor package 100*c* according to an embodiment of the present disclosure, FIG. 6B illustrates the components illustrated FIG. 6A, FIG. 7A illustrates a view taken along line C1-C1' of FIG. 6B, and FIG. 7B illustrates a view taken along line C2-C2' of FIG. 6B. FIG. 6A illustrates a relationship among the first and second support members 121 and 122, the first and second semiconductor chips 101 and 102, and the package substrate 110. In FIGS. 6A through 7B, components having the same reference numerals as those of FIGS. 1A through 1C have substantially the same or similar features as the aforementioned contents, and thus redundant descriptions thereof will be omitted.

Referring to FIGS. 6A through 7B, in a semiconductor package 100*c* according to an embodiment, the opening 113H2 may extend to edges of the first and second support members 121 and 122 to expose a plurality of wiring pads 112P on the second region 111R2. Here, the opening 113H2 may expose at least a portion of each of the first region 111R1 and the second region 111R2 within a range not overlapping the first and second semiconductor chips 101 and 102 and the first and second support members 121 and 122. For example, as illustrated in FIG. 7A, a width of the opening 113H2 in the first direction (X-axis direction) may be substantially the same as a width of the first region 111R1 and the second region 111R2. In addition, as illustrated in FIG. 7B, the opening 113H2 may extend to a region not overlapping the first and second support members 121 and 122, while exposing the wiring pad 112P to which the first and second semiconductor chips 101 and 102 are connected. Depending on an arrangement of the first and second support members 121 and 122 and the first and second semiconductor chips 101 and 102, flowability of the encapsulant 140 may be maintained on the second region 111R2. In an embodiment, the opening 113H2 may provide a mounting region 113R1 of the first and second support members 121 and 122 on the second insulating layers 113, while maximizing an exposed region of the second region 111R2.

Figure 8A:
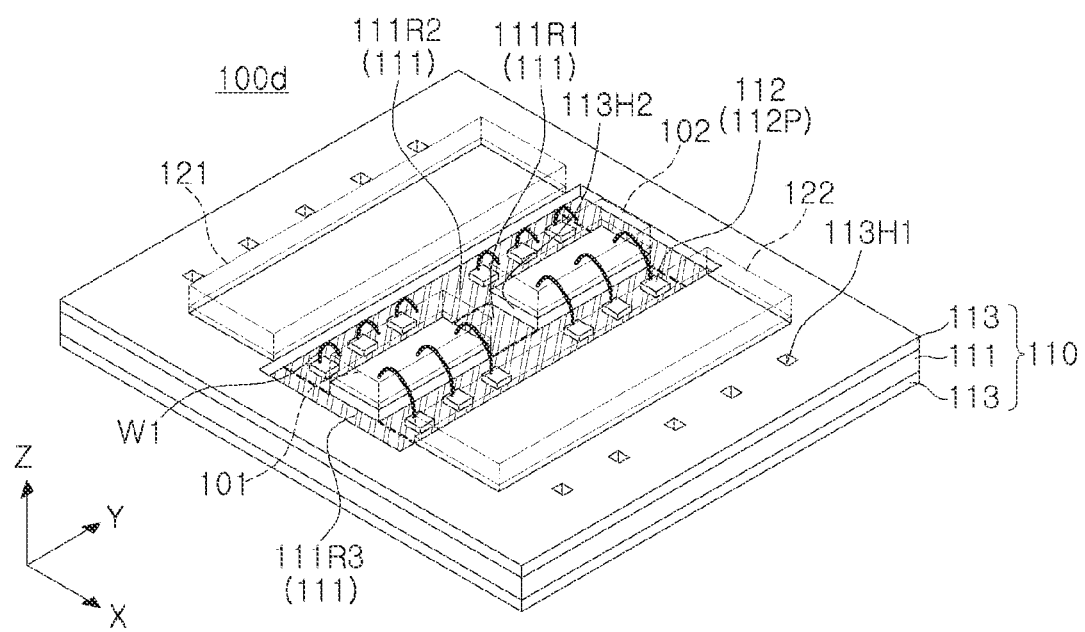
FIG. 8A is a perspective diagram illustrating some components of a semiconductor package according to an embodiment of the present disclosure.
Figure 8B:
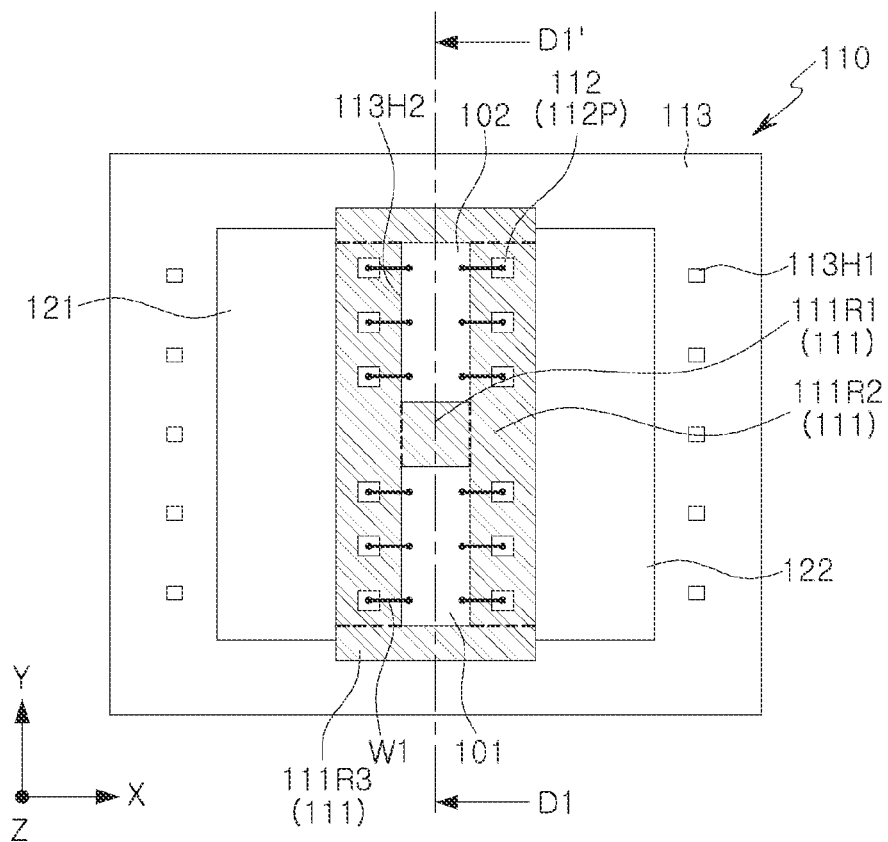
FIG. 8B is a plan diagram illustrating the components illustrated FIG. 8A.
Figure 9:
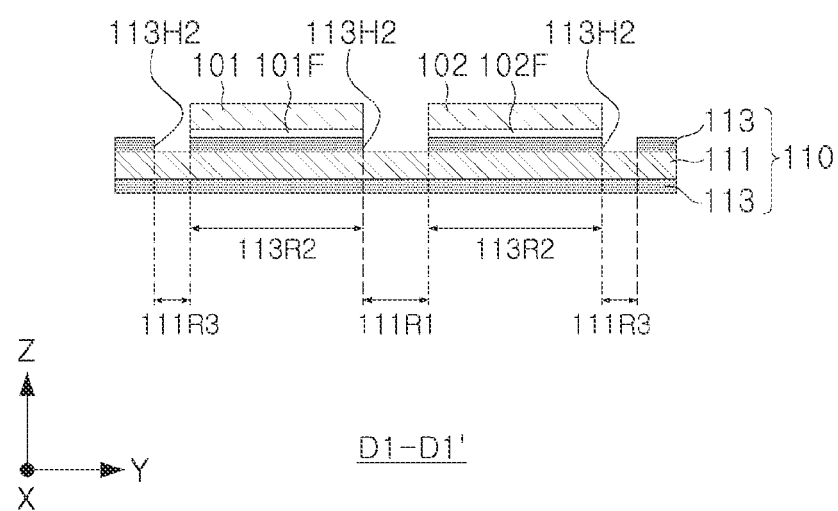
FIG. 9 is a cross-sectional diagram taken along line D1-D1' of FIG. 8B.

FIG. 8A illustrates some components of a semiconductor package 100*d* according to an embodiment of the present disclosure, FIG. 8B illustrates the components illustrated FIG. 8A, and FIG. 9 illustrates a view taken along line D1-D1' of FIG. 8B. FIG. 8A illustrates a relationship among the first and second support members 121 and 122, the first and second semiconductor chips 101 and 102, and the package substrate 110. In FIGS. 8A through 9, components having the same reference numerals as those of FIGS. 1A through 1C have substantially the same or similar features as those described above, and thus redundant descriptions will be omitted.

Referring to FIGS. 8A through 9, in a semiconductor package 100*d* according to an embodiment, the first insulating layer 111 includes a third region 111R3 positioned at both ends of a second region 111R2 in the second direction (Y-axis direction), and the opening 113H2 may further include a third recess region extending from one end of the second recess region exposing the second region 111R2 and exposing at least a portion of the third region 111R3. Here, the opening 113H2 may surround the first and second semiconductor chips 101 and 102 on the X-Y plane, and the mounting region 111R2 of the second insulating layers 113 on which the first and second semiconductor chips 101 and 102 are mounted may be substantially or fully separated from the second insulating layers 113 of another region. For example, as illustrated in FIG. 9, the mounting region 111R2 of the second insulating layers 113 may be separated from the second insulating layers 113 by the opening 113H2 exposing the first region 111R1 and the third region 111R3 of the mounting region 113R2 of the second insulating layers 113 disposed between the first and second semiconductor chips 101 and 102 and the first insulating layer 111. Depending on the arrangement of the first and second support members 121 and 122 and the first and second semiconductor chips 101 and 102, if the width of the first region 111R1 and the second region 111R2 is reduced, the opening 113H2 may extend to an outer side (third region0 of the tunnel structure formed between the first and second support members 121 and 122 to increase flow of the encapsulant.

Figure 10A:
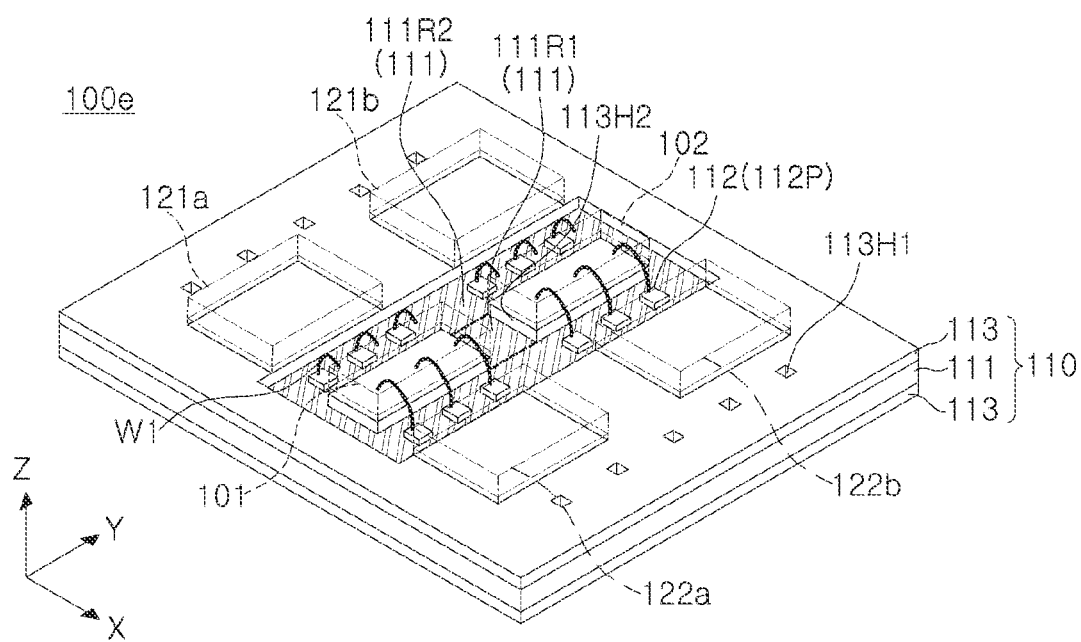
FIG. 10A is a perspective diagram illustrating some components of a semiconductor package according to an embodiment of the present disclosure.
Figure 10B:
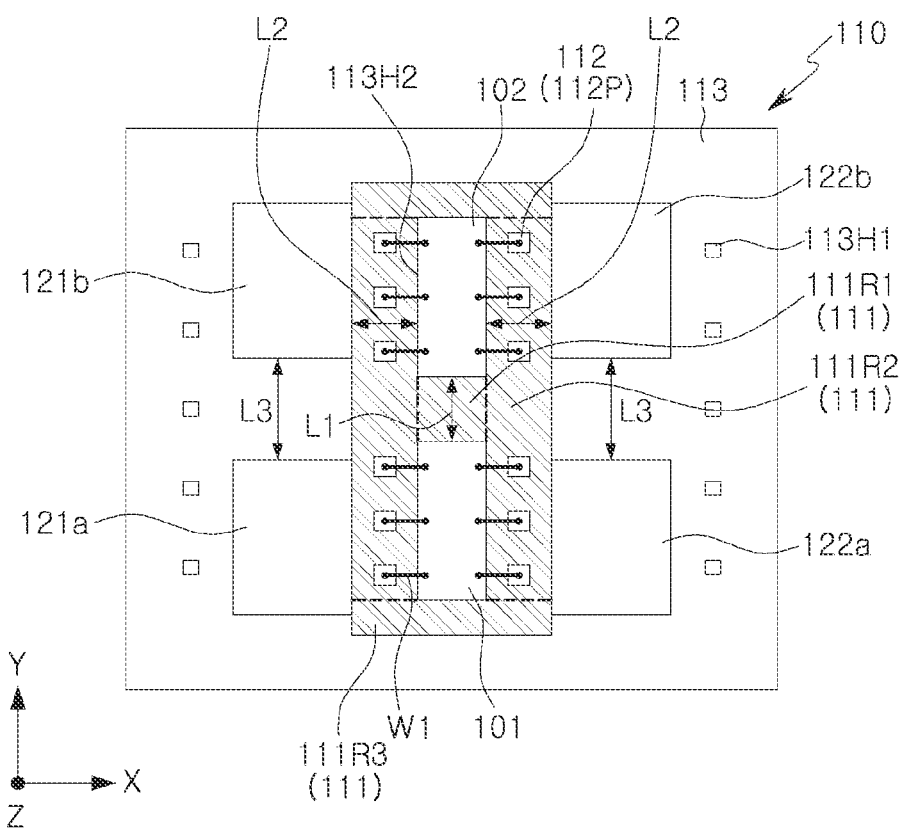
FIG. 10B is a plan diagram illustrating the components illustrated FIG. 10A.

FIG. 10A illustrates some components of a semiconductor package 100*e* according to an embodiment of the present disclosure, and FIG. 10B illustrates the components illustrated FIG. 10A. FIG. 10A illustrates a relationship among the first and second support members 121 and 122, the first and second semiconductor chips 101 and 102, and the package substrate 110. In FIGS. 10A and 10B, components having the same reference numerals as those of FIGS. 1A through 1C have substantially the same or similar features as the aforementioned contents, and thus redundant descriptions thereof will be omitted.

Referring to FIGS. 10A and 10B, the semiconductor package 100*e* according to an embodiment may include a pair of first support members 121*a* and 121*b* and a pair of second support members 122*a* and 122*b* spaced apart from each other in the second direction (Y-axis direction). Here, when an interval L3 between the pair of first support members 121*a* and 121*b* and the interval L3 between the pair of second support members 122*a* and 122*b* are sufficiently secured, the opening 113H2 may not be formed between the pair of first support members 121*a* and 121*b* and the pair of second support members 122*a* and 122*b*. For example, an interval L2 between one of the pair of first support members 121a and 121b and the pair of second support members 122a and 122b and the first and second semiconductor chips 101 and 102 in the first direction (X-axis direction) and an interval L1 between the first and second semiconductor chips 101 and 102 in the second direction (Y-axis direction) may range from about 500 μm to about 1500 μm, and the interval L3 between the support members 121a, 121b, 122a, and 122b may be about 2000 μm or more.

According to embodiments of the present disclosure, a semiconductor package having an increased production yield by preventing non-filling and swelling of an encapsulant may be provided.

While embodiments have been shown and described above by way of example, it will be apparent to those of ordinary skill in the pertinent art that modifications and variations may be made without departing from the scope of the present disclosure as defined by the appended claims.

What is claimed is:

1. A semiconductor package comprising:
a package substrate including a first insulating layer, a wiring layer disposed on the first insulating layer, and a second insulating layer disposed on the first insulating layer and covering at least a portion of the wiring layer;
first and second support members disposed to face each other on the second insulating layer of the package substrate and spaced apart from each other in a first direction;
first and second semiconductor chips disposed between the first and second support members and spaced apart from each other in a second direction, which intersects the first direction;
a stack structure disposed on the first and second support members and the first and second semiconductor chips and including at least one third semiconductor chip; and
an encapsulant disposed on the package substrate and filling a space between the first and second support members and a space between the first and second semiconductor chips,
wherein the second insulating layer has an opening exposing at least a portion of the first insulating layer positioned between the first and second semiconductor chips, and the opening is filled with the encapsulant.

2. The semiconductor package of claim 1, wherein:
the first insulating layer has a first region positioned between the first and second semiconductor chips and a second region positioned between the first and second semiconductor chips and the first and second support members facing each other in the first direction, and
the opening includes a first recess region exposing at least a portion of the first region and extending in the first direction.

3. The semiconductor package of claim 2, wherein the opening further includes a second recess region extending from one end of the first recess region in the second direction and exposing at least a portion of the second region.

4. The semiconductor package of claim 3, wherein the wiring layer includes a plurality of wiring pads disposed in the second region, and the plurality of wiring pads are disposed in the second recess region.

5. The semiconductor package of claim 3, wherein:
the first insulating layer has a third region in the second direction disposed at both ends of the second region, and
the opening further includes a third recess region extending from the both end of the second recess region and exposing at least a portion of the third region.

6. The semiconductor package of claim 1, wherein: the opening does not overlap the first and second semiconductor chips and the first and second support members in a third direction, which intersects the first direction and the second direction.

7. The semiconductor package of claim 1, wherein:
the second direction is substantially perpendicular to the first direction,
a height of the opening ranges from about 10 μm to about 30 μm in a third direction, substantially perpendicular to the first direction and the second direction.

8. The semiconductor package of claim 1, wherein:
the first and second semiconductor chips and the first and second support members are attached to an upper surface of the second insulating layer, and
heights from the upper surface of the second insulating layer to upper surfaces of the first and second semiconductor chips and the first and second support members are substantially the same.

9. The semiconductor package of claim 1, wherein the first to third semiconductor chips are electrically connected to the wiring layer of the package substrate by a bonding wire.

10. The semiconductor package of claim 1, wherein the first insulating layer and the second insulating layer include different insulating materials.

11. The semiconductor package of claim 10, wherein the first insulating layer is prepreg, and the second insulating layer is a solder resist.

12. The semiconductor package of claim 1, wherein the first and second semiconductor chips separately include a memory controller and a frequency boosting interface (FBI) chip, and the third semiconductor chip includes a memory chip.

13. The semiconductor package of claim 1, further comprising a third support member disposed between the stack structure and the first and second support members.

14. A semiconductor package comprising:
a package substrate including a first insulating layer, a wiring layer disposed on the first insulating layer, and a second insulating layer disposed on the first insulating layer and covering at least a portion of the wiring layer;
a pair of support members disposed to face each other on the second insulating layer of the package substrate; and
a pair of semiconductor chips disposed between the pair of support members and electrically connected to the wiring layer,
wherein the second insulating layer has an opening surrounding at least a portion of each of the pair of semiconductor chips,
wherein the opening exposes the first insulating layer.

15. The semiconductor package of claim 14, wherein:
the pair of support members are spaced apart from each other in a first direction, and
the pair of semiconductor chips is spaced apart from each other in a second direction, substantially perpendicular to the first direction.

16. The semiconductor package of claim 15, wherein the opening exposes the first insulating layer in a third direction, substantially perpendicular to the first and second directions.

17. The semiconductor package of claim 16, further comprising an encapsulant filling the opening and directly contacting the first insulating layer.

18. The semiconductor package of claim 15, wherein an interval between the pair of semiconductor chips in the second direction and an interval between one of the pair of support members and the pair of semiconductor chips in the first direction ranges from about 500 μm to about 1500 μm.

19. A semiconductor package comprising:
- a package substrate;
- a pair of support members disposed on the package substrate and facing each other in a first direction;
- at least a pair of semiconductor chips disposed between the pair of support members on the package substrate and facing each other in a second direction, which intersects the first direction;
- a stack structure disposed on the pair of support members and the pair of semiconductor chips; and
- an encapsulant disposed on the package substrate and filling a space between the pair of support members and the pair of semiconductor chips,
- wherein the package substrate includes a first insulating layer and a second insulating layer disposed between the first insulating layer and the pair of support members and the pair of semiconductor chips, and
- wherein the encapsulant is in contact with at least a portion of the first insulating layer between the pair of support members and the pair of semiconductor chips,
- wherein the second insulating layer has an opening surrounding at least a portion of each of the pair of semiconductor chips,
- wherein the encapsulant fills the opening.

20. The semiconductor package of claim 19, wherein:
- the second direction is substantially perpendicular to the first direction,
- the package substrate further includes a wiring layer disposed on the first insulating layer,
- the wiring layer includes a plurality of wiring pads disposed adjacent the pair of semiconductor chips, and
- the pair of semiconductor chips is electrically connected to the plurality of wiring pads,
- the opening exposes the first insulating layer,
- the encapsulant directly contacts the first insulating layer.

* * * * *